US008864955B2

(12) United States Patent
Benoit et al.

(10) Patent No.: US 8,864,955 B2
(45) Date of Patent: Oct. 21, 2014

(54) PROCESS TO APPLY HEATER FUNCTION TO PLASTIC SUBSTRATE

(75) Inventors: Gilles Benoit, Ozoir la Ferriere (FR); Farid Manzeh, L'Hay les Roses (FR); Christophe Laloup, Montgeron (FR)

(73) Assignee: SMR Patents S.a.r.l., Luxembourg (LU)

( * ) Notice: Subject to any disclaimer, the term of this patent is extended or adjusted under 35 U.S.C. 154(b) by 694 days.

(21) Appl. No.: 12/908,319

(22) Filed: Oct. 20, 2010

(65) Prior Publication Data

US 2011/0096398 A1 Apr. 28, 2011

(30) Foreign Application Priority Data

Oct. 22, 2009 (EP) .................................... 09173733
Jun. 10, 2010 (EP) .................................... 10165508

(51) Int. Cl.
*C23C 14/34* (2006.01)
*H05B 3/84* (2006.01)

(52) U.S. Cl.
CPC ............ *H05B 3/84* (2013.01); *H05B 2203/017* (2013.01)
USPC ............ 204/192.14; 204/192.26; 204/192.27; 204/192.3; 216/94

(58) Field of Classification Search
USPC ............. 204/192.14, 192.15, 192.26, 192.27, 204/192.28, 192.3, 192.32; 216/94, 100
See application file for complete search history.

(56) References Cited

U.S. PATENT DOCUMENTS 4,721,550 A 1/1988 Schumacher, III
4,882,466 A * 11/1989 Friel ............................ 219/219
4,964,962 A * 10/1990 Nobutani et al. .......... 204/192.3
6,171,714 B1 * 1/2001 Bergkessel et al. ........... 428/618
2003/0001301 A1 1/2003 Duroux et al.
2003/0188964 A1 * 10/2003 Hasegawa ................ 204/192.17

FOREIGN PATENT DOCUMENTS

EP 0677434 10/1995
JP 2002-083668 * 3/2002

OTHER PUBLICATIONS

Machine Transaltion of JP 2002-083668 dated Mar. 2002.*

* cited by examiner

*Primary Examiner* — Rodney McDonald
(74) *Attorney, Agent, or Firm* — Reising Ethington P.C.

(57) ABSTRACT

The invention is related to a process to apply a heater function to a plastic glass that was made of a polycarbonate. The process includes a sputtering process that allows producing high performance heater function on a plastic glass. Another aspect of the invention is the plastic glass mirrors produced by the inventive process.

7 Claims, 3 Drawing Sheets

PROCESS TO APPLY HEATER FUNCTION TO PLASTIC SUBSTRATE

BACKGROUND ART

The invention is based on the priority patent applications EP 09173733.8 and EP 10165508.2 which are hereby incorporated by reference.

1. Field of the Invention

The invention is related to a process to apply heater function to a plastic glass that is made of a polycarbonate.

More especially the invention is related to a sputtering process that allows to produce high performance heater function on a plastic glass.

Another aspect of the invention is the plastic glass mirror produced by the inventive process.

2. Description of the Related Art

Plastic glass is known in prior art to replace normal silica glasses. For example in EP1412158 a method is disclosed that allows producing plastic glass in a high quality. Typical plastics include optical grade injection mouldable material, optical grade polycarbonates, methacrylates or methacrylate modified polycarbonates. Suitable materials are obtainable from General Electric, for instance, plastics sold under the trade designations MAKROLON 2207 and LEXAN LS2 are particularly suitable in processes. Also, it is necessary to provide optical quality polished mould surfaces to maintain the optical properties of the finished part.

For heating of rear view minors several methods are used. In the EP 0677434 a solution is proposed that heats the mirror with a resistive metal layer. This layer is sputtered on the minor glass and contacted by electrodes separated by isolating layer in between. The electrodes are connected at one side of the minor, a solution that uses a two-way connector for the power supply of the circuit and thus eases the associated electric bundle.

The use of a restive layer and additional electrodes arises some problems with a harmonious defrosting function. Hot spots occur and can destroy the heating layer.

In U.S. Pat. No. 4,721,550 a printed circuit board is layered by a copper layer. The patent discloses a method to create a very adhesive copper layer on a substrate with a crystalline structure achieved in a porous surface of the polymer substrate.

The deposition of layers with Physical Vapor Deposition (PVD) methods is well known. One successful method is magnetron sputtering.

Magnetron sputtering is a powerful and flexible technique which can be used to coat virtually any work piece with a wide range of materials. Sputtering is the removal of atomised material from a solid due to energetic bombardment of its surface layers by ions or neutral particles. Prior to the sputtering procedure a vacuum of less than one ten millionth of an atmosphere must be achieved. From this point a closely controlled flow of an inert gas such as argon is introduced. This raises the pressure to the minimum needed to operate the magnetrons, although it is still only a few ten thousandth of atmospheric pressure.

When power is supplied to a magnetron a negative voltage of typically −300V or more is applied to the target. This negative voltage attracts positive ions to the target surface at speed. Generally when a positive ion collides with atoms at the surface of a solid an energy transfer occurs. If the energy transferred to a lattice site is greater than the binding energy, primary recoil atoms can be created which can collide with other atoms and distribute their energy via collision cascades.

Aside from sputtering the second important process is the emission of secondary electrons from the target surface. These secondary electrons enable the glow discharge to be sustained.

It is the intention of the invention to overcome the problems of a heater using a resistance layer and separate electrodes and to provide a method using PVD Magnetron process to apply a single layer with a double function to heat and to contact the plastic glass mirror.

SUMMARY OF THE INVENTION

The invention is shown in the figures and shortly described there after.

To use a single metal layer at the backside of the plastic glass minor eases the whole production process. An additional step of applying electrodes is not necessary. The problem that the electrode layer and the resistive heating layer must have the necessary adhesion disappears.

The use of a material layer covering the whole plastic substrate is only possible for the plastic substrate because the plastic material has a low thermal conductivity compared to a silicon glass. The temperature effects of a restrictive heating lead would locally applied to the plastic substrate. The risk that the leads will be too hot and melt is high for the temperature differences are high and the energy transport slow in plastic glass.

The approach is to use the whole surface as heating area for avoiding too high currents due to local high resistances. So the invention uses copper as material with low resistance and applies it on the whole surface. The invention solves the problem of hot spots on plastic glass and the problem of attach electrodes in one step.

DETAILED DESCRIPTION OF THE PREFERRED EMBODIMENT

Figure 1:
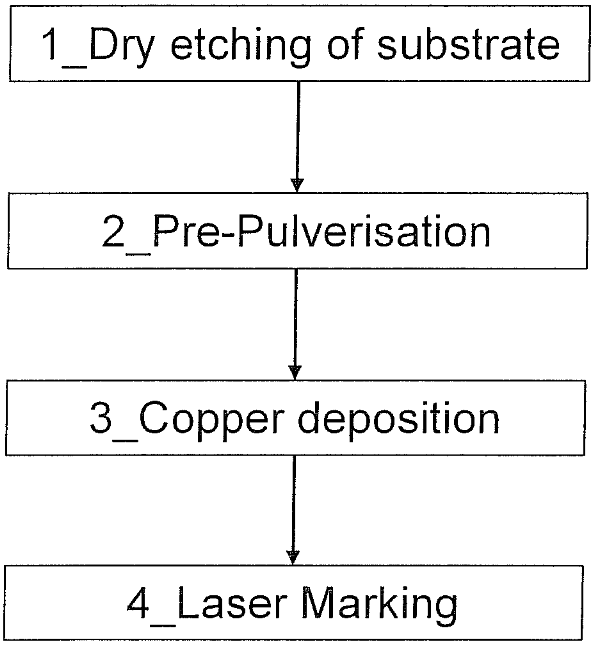
FIG. 1 shows a logic chart of one embodiment of the method steps.

The substrate is formed from any dielectric material that is normally acceptable for plastic glass mirror use, and such substrate may be formed, for example, from polycarbonate, methacylates or methacrylate modified polycarbonates etc. Such a substrate typically has a thickness of several millimetres and a thermal conductivity of 0.3-0.6 W/m K compared to glass with 1.1 W/m K.

In a process which is not further described the reflective layer is applied to the first surface. The reflective layer will be normally a metal or a metal alloy. After the application of the reflective layer the heater layer is applied on the other of the none reflective surface of the substrate.

The follow up of the process steps can be changed in an alternative process resulting in first applying the heating layer than the reflective layer. This does not influence the invention.

The second side of the substrate is preferably first coated with copper by sputtering, with the sputtered film forming a hermetic seal on the substrate that is sufficiently thick to carry the current causing significant heating. The sputtered film thickness is preferably between about 0.4 to 1 μm in thickness.

Prior to sputtering of the thin conductive film onto the substrate, the substrate is preferably first prepared by dry etching step.

The process starts in that the plastic glass substrates are fed into a PVD magnetron drain.

After the chamber is evacuated the first process step starts with dry etching of the polycarbonate substrate surface. For this purpose the substrate is mounted on a substrate holder that is rotated with around 5 cycles per minute. The copper target in the Magnetron PVD is covered. The drain contains an Oxygen atmosphere and the polarity of the deposition process is changed so that the target is on mass and the substrate side has a high voltage of around 700 V. The starting plasma reaction creates ionic Oxygen molecules that are accelerated versus the substrate. The surface of the substrate is etched by the Oxygen molecules and prepared for copper deposition. The dry etching time depends on several parameters and the best results are achieved with etching times of 5 to 10 minutes.

The surface is structured by Oxygen molecules with a certain roughness and the surface is activated in some way to improved adhesion of copper.

In step 2 the drain atmosphere is changed from Oxygen to an Aragon atmosphere. The polarity of the electrodes is changed to bring the target cathode to a high voltage level. A power of around 5 kW is applied for 20 seconds. During this time the target remains covered. The intention of this step is to clean the target and delete possible oxidization of the copper target surface.

In Step 3 the substrate is sputtered in an atmosphere of Argon where the power of plasma deposition is around 10 kW. The substrate continues to rotate on the substrate holder and the deposition of copper takes place during the deposition time of 4 to 10 minutes to achieve the layer thickness that is planned to heat the device.

The copper target is opened to Argon plasma impact.

The copper layer has a good adhesion to the polycarbonate surface due to the dry etching process of step 1. The layer is polycrystalline and has harmonious resistance behaviour.

Figure 2:
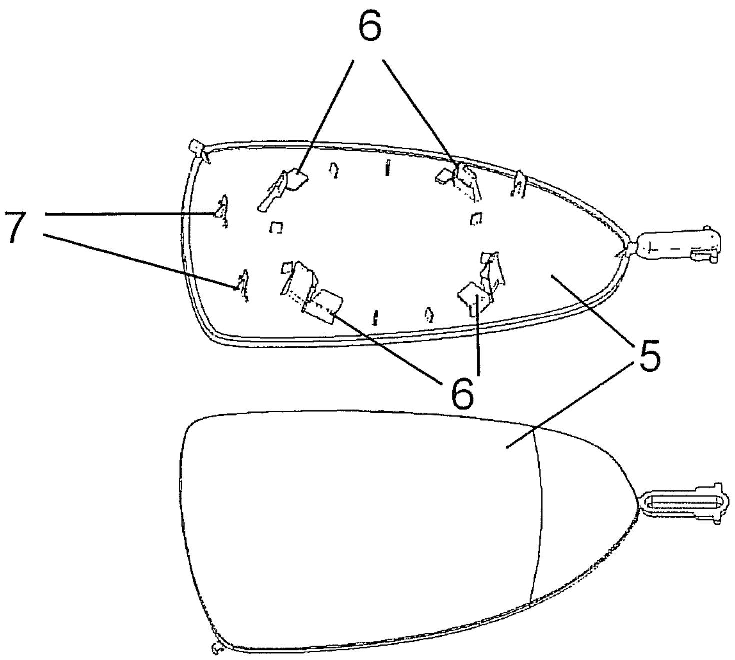
FIG. 2 shows an example of the structure of a plastic glass.

FIG. 2 shows a plastic minor glass 5. The part below shows the reflective side of the plastic glass. The upper part shows a view from the rear side. In this example the plastic glass substrate 5 has moulded parts as clips 7 to fix the glass on a support or a glass actuator.

In addition noses 6 for contacting the heater surface are moulded with the plastic glass substrate. The noses 6 are arrange on the same side of the minor in this embodiment. This eases the connection to the harness. For the invention the location of the moulded noses are not important. In alternative embodiments the noses can be moulded at different positions or alternatively the clips 7 can function as noses for contacts too. Combining clips attachment function and nose contacting function in one device would again ease the connection of the electrodes and heating layer.

Figure 3:
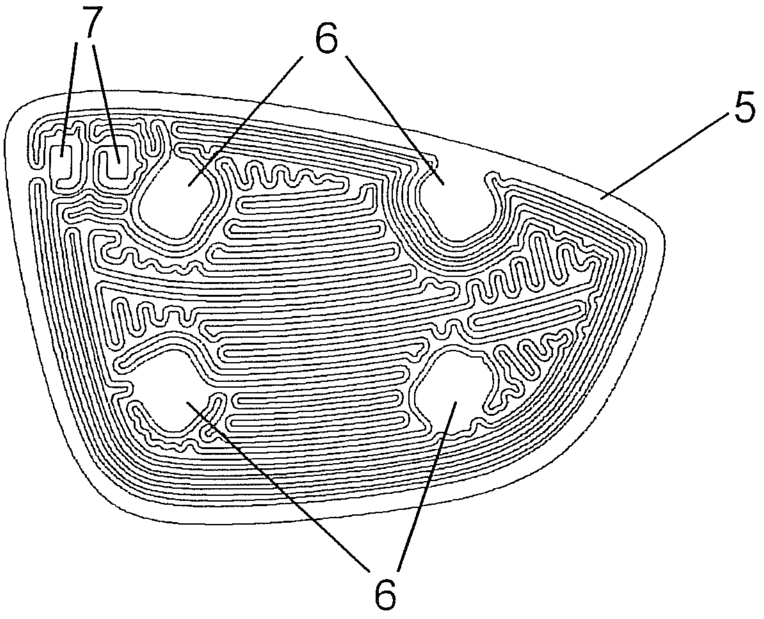
FIG. 3 shows a track structure.

After the cooper layer is sputtered onto the second surface of the substrate the substrate undergoes a further process step. The heater surface is structured with a laser beam. An UV-laser with a wavelength of 355 nm is used to inscribe a pattern into the copper layer. The copper layer is evaporated under the power of the laser beam so that a pattern occurs in the copper layer. The inscribing process must be efficiently evaporating the copper between the structure to avoid short cuts. FIG. 3 shows an example. With the laser beam the electrodes are separated from each other and a meander structure is achieved. The geometrical form of the structure as such is not relevant, but the structure is adapted to achieve the resistance that is optimal. The laser beam must at least separate the two noses 7 that are used to contact the layer. During the laser beam structure process the resistance is controlled with an ohmmeter. It is an advantage that the noses are covered by copper in the sputtering process too, so that the contact for the measurement can be easily realized. The optimal solution is achieved if the resistance results between 5 and 30 Ohms for the tracks.

During the inscribing operation the surface is controlled via an IR camera to avoid hot spots. The impact of the laser beam must be limited to avoid destruction of the reflective layer on the first surface.

The inscribing process is in one embodiment done by a laser beam that is guided deflecting means to follow the track. It could be also realized in using a mask and an unfocused high energy beam.

After the tracks are realized in the copper layer the plastic glass is provided to a hard coating process, which protects the reflective layer on the first surface and the heater layer on the backside to abrade.

The final step after the hard coating is to connect the noses 6 with an electrical source. For this purpose flags are mounted and soldered to the noses.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:

1. A process to apply a heater function onto a plastic substrate with a first surface reflectively coated and a second surface, the method comprising the steps of: inserting the plastic substrate as formed from a dielectric material into a sputtering process chamber; cleaning the second surface of the substrate by a dry etching step; preparing a copper target in a sputtering process chamber in a pre step; sputtering copper onto the second surface; removing the layered substrate from the sputtering process chamber; and inscribing tracks onto the second surface of the layered substrate with a laser beam.

2. Process according claim 1 characterized in that the the second surface is prepared in the dry etching process step to achieve a roughness of the second surface and to activate the second surface with Oxygen ions.

3. Process according claim 1 characterized in that the copper deposition time is between 4 and 10 minutes.

4. Process according claim 1 characterized in that the resulting copper layer on the second surface of the plastic substrate has a thickness of 0.4 to 1 μm.

5. Process according claim 1 characterized in that the copper layer is structured by the laser beam to a meander structure.

6. Process according claim 5 characterized in that the meander structure of the copper layer has a resistance between 5 and 30 Ohms.

7. A method to produce a heatable rear view mirror, comprising the steps:

providing a plastic substrate having a first surface, a second surface, and at least two molded noses;

applying a reflective layer on the first surface;

applying copper onto the second surface and the at least two molded noses using a sputtering process to provide a copper layer on the second surface and the two molded noses;

inscribing tracks into the copper layer with a laser beam to form electrodes;

applying a hard coating process on the substrate; and electrically connecting the at least two noses with an electrical source.

* * * * *